US010914759B2

(12) United States Patent
Krause

(10) Patent No.: US 10,914,759 B2
(45) Date of Patent: Feb. 9, 2021

(54) METHOD FOR PLACING AND CONTACTING A TEST CONTACT

(71) Applicant: PAC TECH—PACKAGING TECHNOLOGIES GMBH, Nauen (DE)

(72) Inventor: Thorsten Krause, Velten (DE)

(73) Assignee: PAC TECH—PACKAGING TECHNOLOGIES GMBH, Nauen (DE)

(*) Notice: Subject to any disclaimer, the term of this patent is extended or adjusted under 35 U.S.C. 154(b) by 0 days.

(21) Appl. No.: 16/063,862

(22) PCT Filed: Dec. 6, 2016

(86) PCT No.: PCT/EP2016/079872
§ 371 (c)(1),
(2) Date: Jun. 19, 2018

(87) PCT Pub. No.: WO2017/121542
PCT Pub. Date: Jul. 20, 2017

(65) Prior Publication Data
US 2019/0011483 A1   Jan. 10, 2019

(30) Foreign Application Priority Data
Jan. 14, 2016 (DE) .................. 10 2016 100 561

(51) Int. Cl.
*G01R 1/44* (2006.01)
*G01R 1/067* (2006.01)
(Continued)

(52) U.S. Cl.
CPC ............ *G01R 1/44* (2013.01); *G01R 1/06705* (2013.01); *G01R 1/06733* (2013.01); *G01R 1/073* (2013.01); *G01R 3/00* (2013.01)

(58) Field of Classification Search
CPC ...... G01R 1/44; G01R 1/06705; G01R 31/44; G01R 31/50; H01L 2924/15174; H01L 2224/1309; H01L 2924/00013
(Continued)

(56) References Cited

U.S. PATENT DOCUMENTS 4,970,365 A   11/1990   Chalco
5,122,635 A   6/1992    Knodler et al.
(Continued)

FOREIGN PATENT DOCUMENTS

CN   102205464 A   10/2011
CN   203936498 U   11/2014
(Continued)

OTHER PUBLICATIONS

Burke, et al., Laser Heating and Detection of Bilayer Microcantilevers for Non-Contact Thermodynamic Measurements, Applied Physics Letters, 2013, 102:021916, 3 pages.
(Continued)

*Primary Examiner* — Melissa J Koval
*Assistant Examiner* — Trung Nguyen
(74) *Attorney, Agent, or Firm* — Quarles & Brady LLP

(57) ABSTRACT

The invention relates to a method for placing and contacting a contact element formed in particular as a test contact of a test contact arrangement, wherein in said method, for forming a heat transfer surface, a contact head provided with a contact element holding device, with the contact element received in the contact element holding device, is placed between the contact element and a contact material deposit arranged on a contact surface of a contact carrier in the direction of a feeding axis against a contact surface of the connecting material deposit, and, for realizing an at least partial fusing of the connecting material deposit and for producing a materially bonded connection between the
(Continued)

contact element and the connecting material deposit, thermal energy is introduced into the connecting material deposit by means of treating the contact element with thermal energy, the temperature T of the contact element being measured while the contact element is being treated and the duration of the treatment being defined as a function of a determined temperature gradient dT/dt of the temperature T of the contact element.

11 Claims, 5 Drawing Sheets

(51) Int. Cl.
  *G01R 1/073* (2006.01)
  *G01R 3/00* (2006.01)

(58) Field of Classification Search
  USPC .............. 324/500, 750.01–750.11, 104, 105, 324/702–703, 750.24, 754.03, 754.1, 324/754.11, 754.21
  See application file for complete search history.

(56) References Cited

U.S. PATENT DOCUMENTS

| | | | |
|---|---|---|---|
| 6,313,653 B1* | 11/2001 | Takahashi | G01R 31/2863 324/750.03 |
| 2011/0210099 A1 | 9/2011 | Heinrici et al. | |
| 2011/0235681 A1* | 9/2011 | Azdasht | H01L 21/76897 374/208 |
| 2016/0279725 A1 | 9/2016 | Azdasht | |
| 2017/0117241 A1* | 4/2017 | Erwin | H01L 24/11 |

FOREIGN PATENT DOCUMENTS

| | | |
|---|---|---|
| DE | 19602591 A1 | 7/1997 |
| DE | 19549635 B4 | 12/2004 |
| DE | 102008051853 A1 | 4/2010 |
| DE | 102010039238 A1 | 2/2012 |
| JP | 2000040712 A | 2/2000 |
| JP | 2000218383 A | 8/2000 |
| JP | 2008232722 A | 10/2008 |
| WO | 2009156505 A1 | 12/2009 |
| WO | 2017032532 A1 | 3/2017 |

OTHER PUBLICATIONS

Liu, et al., Temperature Monitoring in Laser Assisted Polymer Bonding for MEMS Packaging Using a Thin Film Sensor Array, IEEE Sensors Applications Symposium, 2009, pp. 52-55.

Pacardo, et al., A Temperature Microsensor for Measuring Laser-Induced Heating in Gold Nanorods, Anal. Bioanal. Chem, 2015, 407:719-725.

PCT International Search Report and Written Opinion, PCT/EP2016/079872, dated Mar. 31, 2017, 21 pages.

PCT English Language Translation of the International Preliminary Report on Patentability, PCT/EP2016/079872, dated Jul. 26, 2018, 9 pages.

China National Intellectual Property Administration, Second Office Action and Search Report, Application No. 201680079427.2, dated Aug. 11, 2020, 19 pages.

China National Intellectual Property Administration, First Office Action and Search Report, Application No. 201680079427.2, dated Dec. 24, 2019, 17 pages.

Korean Intellectual Property Office, Notice of Rejection, Application No. 10-2018-7018534, dated Nov. 7, 2019, 15 pages.

* cited by examiner

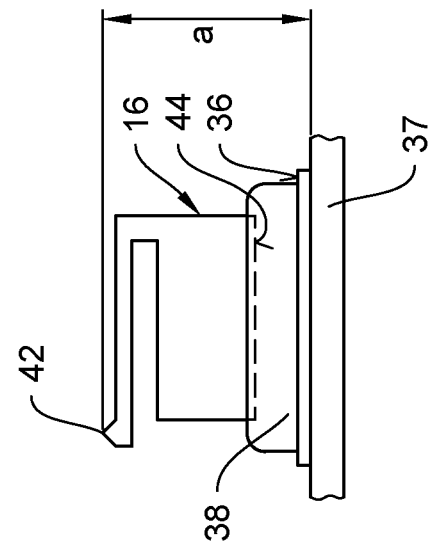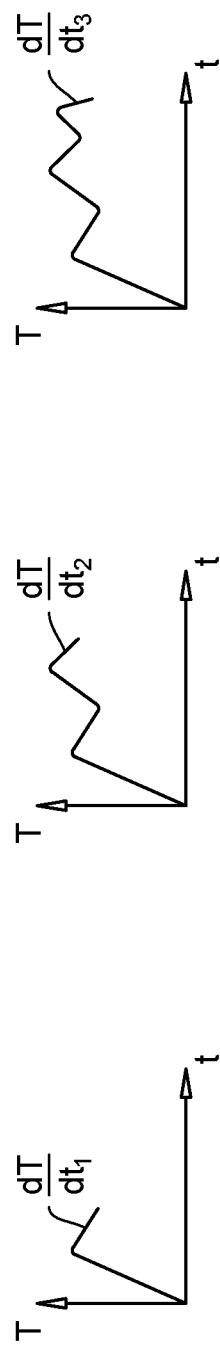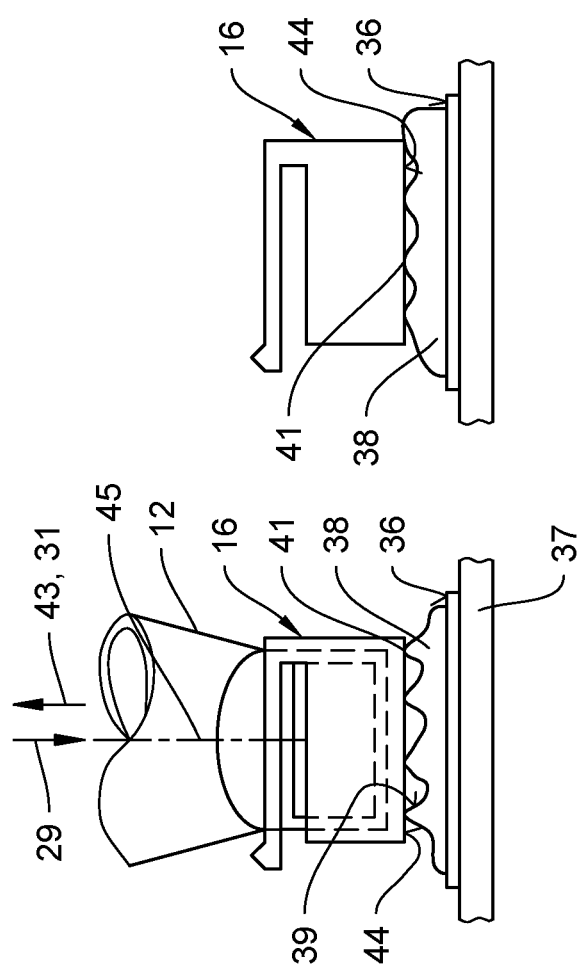

METHOD FOR PLACING AND CONTACTING A TEST CONTACT

CROSS-REFERENCE TO RELATED APPLICATIONS

This application represents the national stage entry of PCT International Application No. PCT/EP2016/079872 filed on Dec. 06, 2016, which claims the benefit of German Patent Application No. 10 2016 100 561.4 filed on Jan. 14, 2016, the entire contents of which are incorporated herein by reference for all purposes.

The present invention relates to a method for placing and contacting a contact element formed in particular as a test contact of a test contact arrangement, wherein in said method, for forming a heat transfer surface, a contact head, which is provided with a contact element holding device, with the contact element received in the contact element holding device, is placed between the contact element and a contact material deposit arranged on a contact surface of a contact carrier in the direction of a feeding axis against a contact surface of the connecting material deposit, and, for realizing an at least partial fusing of the connecting material deposit and for producing a materially bonded connection between the contact element and the connecting material deposit, thermal energy is introduced into the connecting material deposit by means of treating the contact element with thermal energy.

Test contact arrangements having a plurality of test contacts are arranged on a shared test platform provided with a control device for controlling the individual test contacts. The test contacts are arranged in a matrix arrangement corresponding to the chips arranged in a wafer composite so that a defined contacting of the individual chips is possible on a wafer plane via the individual test contacts.

For producing a test contact arrangement, the individual test contacts are arranged on a contact carrier formed as a test circuit board corresponding to the desired matrix arrangement of their contact tips and are soldered to contact surfaces formed on the test circuit board. Due to the high density of the test contacts on each test circuit board and the resulting small distance between the test contacts, particularly high demands exist regarding an electrically reliable as well as an exactly positioned contacting of the test contacts on the circuit board.

Since the individual chips arranged in the wafer composite are located in a shared wafer plane defined by the surface of the wafer, it is essential for a contacting of the individual chips, which should be realized by means of a uniform contact force, that the contact tips of the test contacts arranged in a matrix arrangement are also located in a common contacting plane. For this purpose, the contact tips of the individual test contacts must be arranged at with a uniform contact distance with respect to the contact carrier of the test circuit board. Therefore, not only are the test contacts positioned in an X, Y plane parallel to the surface of the contact carrier when placing the test contacts onto the contact surfaces of the contact carrier, but moreover the test contacts are positioned along the Z axis perpendicular to the surface of the contact carrier in order to enable a corresponding contact distance of the contact tips with respect to the surface of the contact carrier.

In current practice, placing the test contacts against the surface of the connecting material deposit arranged on the contact surfaces of the contact carrier is realized with a defined contact force and by heating the test contacts over a sufficiently long heating duration, which ensures that the connecting material deposits fuse at least to such an extent that the test contacts are embedded in the fused connecting material deposits with a lower contact edge and then the desired contact distance can be set via suitable placing movements of the contact head in the direction of the Z axis. Subsequently the test contacts are released from the test contact holding device of the contact head.

In current practice, placing and contacting of the test contacts is effected with a constant heating duration, said heating duration being determined empirically, in particular as a function of the material composition of the connecting material deposit. In doing so, it has turned out that in particular due to the partly different morphology of the individual connecting material deposits, which results in a different surface topography of the connecting material deposits, correspondingly different heating times are indeed required in order to at least partially fuse the connecting material deposits, which ensures that the test contacts can be embedded into the connecting material deposit with their lower contact edge and the desired uniform contact distance can be set.

Due to the heating times set to be constant in known practice, contact distances of different heights in one and the same matrix arrangement of test contacts can therefore occur due to inadequate fusing of part of the connecting material deposits.

It is therefore the object of the present invention to propose a method for placing and contacting a test contact which ensures setting a defined contact distance with respect to a contact carrier.

In order to attain this object, the method according to the invention comprises the features of claim 1.

According to the invention, the temperature of the contact element is measured while treating the contact element with thermal energy and the duration of the treatment is defined as a function of a determined temperature gradient of the temperature of the contact element.

The invention makes use of the finding that the heat transfer from the contact element treated with thermal energy to the connecting material deposit essentially depends on the heat transfer surface formed between the contact element and the surface of the connecting material deposit. The heat transfer surface thereby essentially results from the surface topography of the connecting material deposit, which changes, however, due to the continuing partial fusing of the connecting material deposit over the heating duration. This has a direct effect on the temperature gradient of the temperature of the contact element, which results from the heat transfer from the contact element to the connecting material deposit. This means that a relatively small heat transfer surface and a correspondingly small temperature gradient is formed in a starting phase of the physical contact established between the contact element and the connecting material deposit due to a largely jagged surface topography of the connecting material deposit, since only a correspondingly small amount of heat is transferred from the contact element to the connecting material deposit. In a subsequent transfer phase during the continued heating of the contact element, the progressing fusing of the connecting material deposit results in a leveling of the surface topography, thus resulting in a correspondingly enlarged heat transfer surface as well as an increased temperature gradient. In an end phase of the heating duration, an embedding of the contact edge of the contact element into the connecting material deposit by means of a reoccurring increase in the temperature gradient is eventually realized due to the progressing fusing of the connecting material deposit.

The method according to the invention therefore makes use of the association between the progression of the temperature gradient of the temperature of the contact element and the fusing state of the connecting material deposit. Thus, the heating duration can be individually defined for every individual contact between a contact element and a connecting material deposit so that it is ensured that thermally treating the contact element is realized only as long as it is required for sufficiently fusing the connecting material deposit as a prerequisite for setting a defined contact distance.

Apart from the fact that faulty contacts between contact elements and connecting material deposits can thus be avoided, the duration for heating a contact element can thus be reduced to a minimum so that it is possible to reduce the production time for producing a test contact arrangement having a plurality of contact elements realized as test contacts arranged on a contact carrier in a matrix arrangement.

Optionally, treating the contact with thermal energy can be realized as a function of the amount or progression of the temperature gradient.

If treating the contact element with thermal energy is realized by means of laser radiation, a direct heat input into the contact element can be realized, which allows setting exactly defined heating processes for the contact element.

It is particularly advantageous if a change in the relative position of the contact head is realized with respect to the contact carrier for setting a defined relative position of the contact element materially bonded to the connecting material deposit on the contact carrier after reaching a defined temperature gradient and before terminating the treatment with thermal energy.

It is particularly advantageous if a displacement of the contact head on the feeding axis is realized for setting a defined relative position of the contact element on the contact carrier.

Preferably, the contact element is released from the test contact holding device after the contact element has been positioned and following a cooling phase of the contact element after terminating the treatment of the contact element with thermal energy.

Measuring the temperature of the contact element can be realized by means of measuring the thermal radiation reflected by a reference surface of the contact element so that measuring a temperature is made possible without any contact.

It is particularly advantageous if the reference surface corresponds to an absorption surface of the contact element, said absorption surface being treated with thermal energy, so that one and the same beam channel can be used for heat treatment as well as for temperature measurement when thermally treating the contact element with laser radiation.

For this purpose, measuring the temperature can be realized in a particularly advantageous manner by means of a beam splitter arranged in a beam path for treating the absorption surface with laser radiation, a an offtake of an infrared radiation portion from the radiation reflected by the absorption surface being realized via the beam splitter for application of said infrared radiation portion to a sensor device.

According to a possible variant, the reference surface can be formed by a surface of the test contact opposite to the absorption surface, measuring the temperature then being able to be realized, in a particularly advantageous manner, by means of a beam channel directed to the reference surface and to a sensor device.

In a preferred embodiment of the method, measuring the temperature is realized by means of the sensor device being allocated to a controlling device of a laser device for treating the contact element with laser radiation, said controlling device controlling the operation of the laser device as a function of a temperature gradient determined based on a sensor output signal.

In the following, a preferred embodiment of the invention is further described with reference to the attached drawing.

In the figures,

FIG. 4 shows the contacting process between the test contact and a connecting material deposit arranged on the contact surface of the contact carrier in a first contacting phase;

FIG. 5 shows the contacting process in a second contacting phase;

FIG. 6 shows the contacting process in a third contacting phase;

Figure 1:
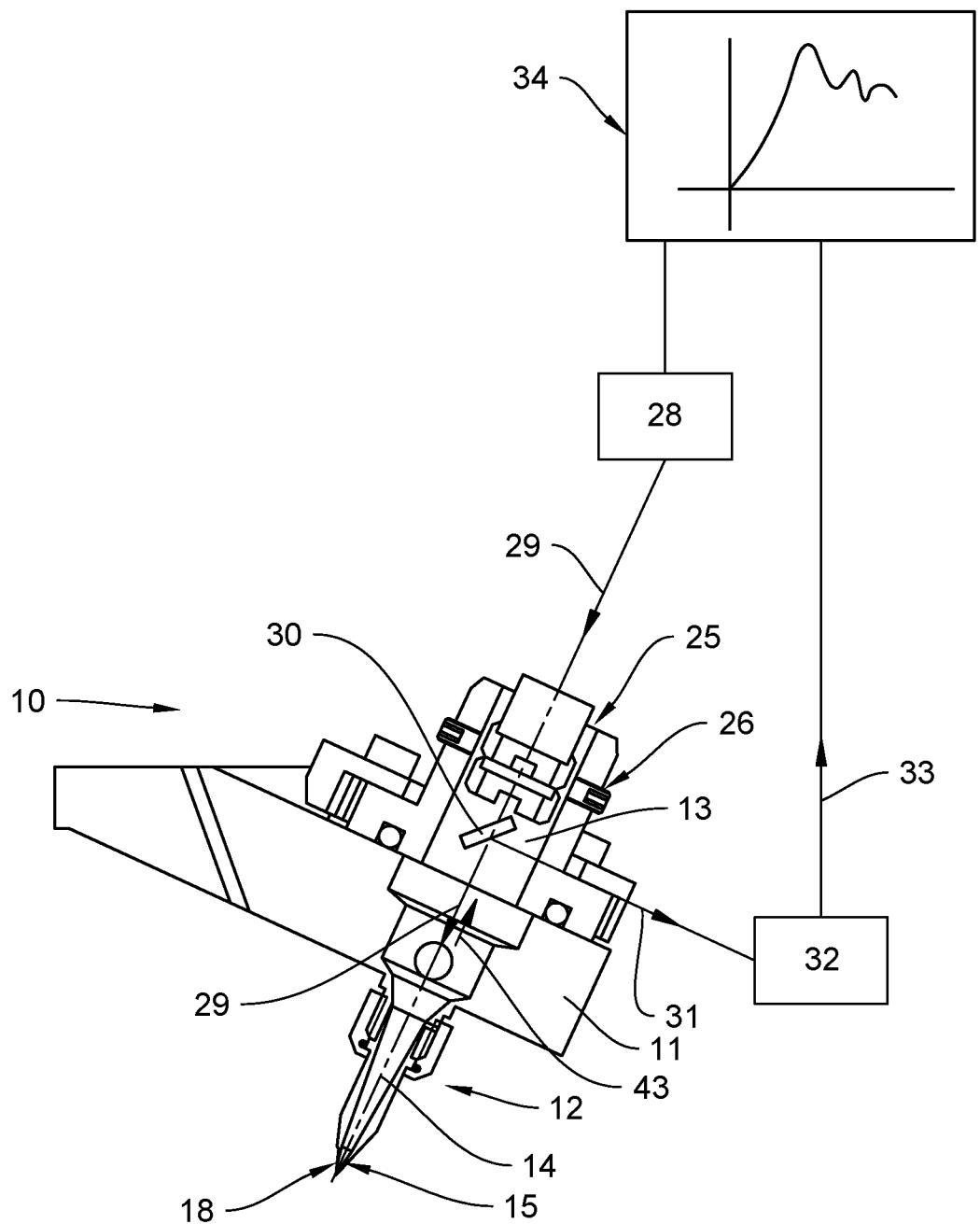
FIG. 1 shows a contact head for placing and contacting a test contact on a contact carrier in a first embodiment.
Figure 2:
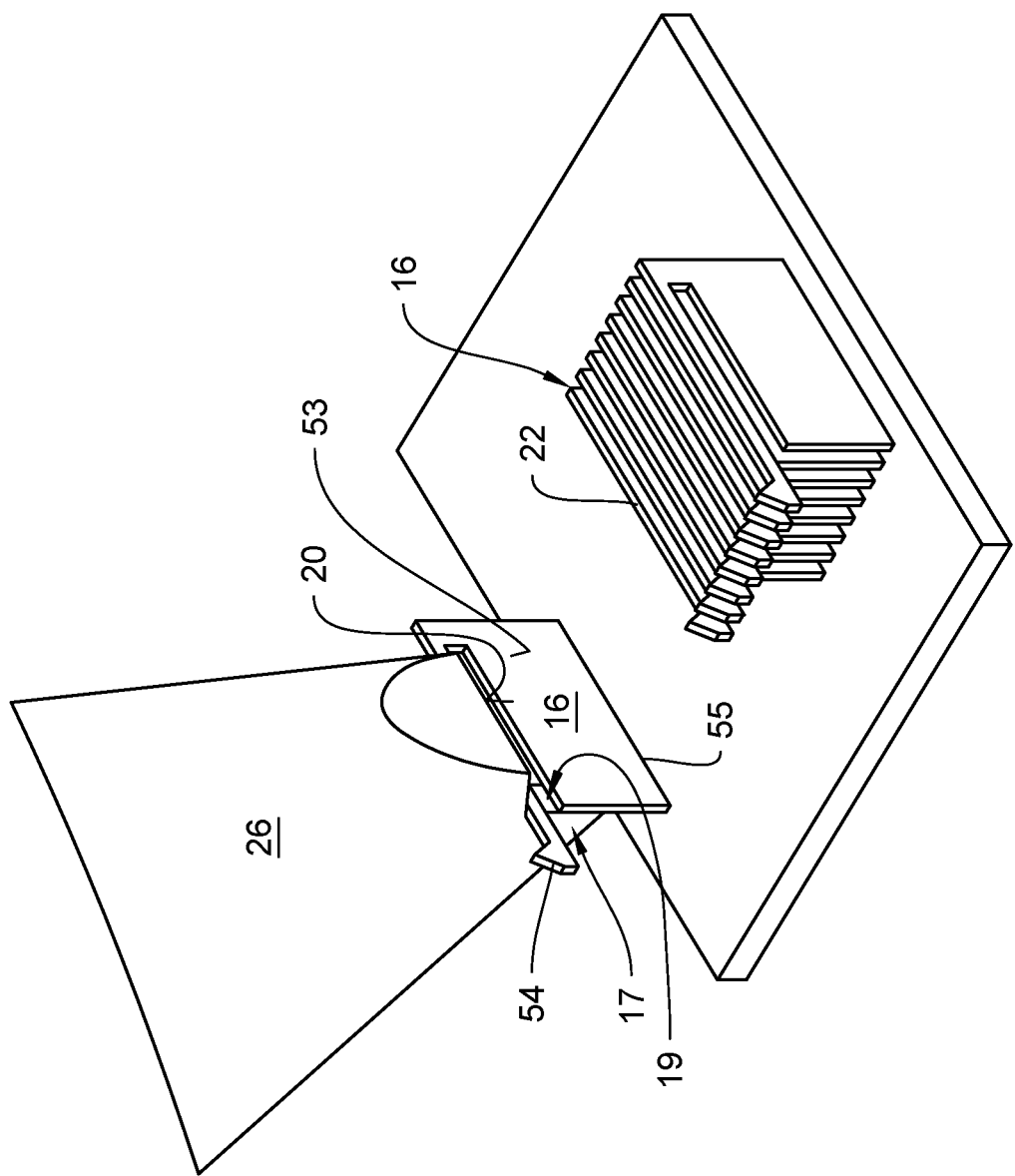
FIG. 2 shows a test contact being placed on a contact carrier for producing a test contact arrangement.
Figure 3:
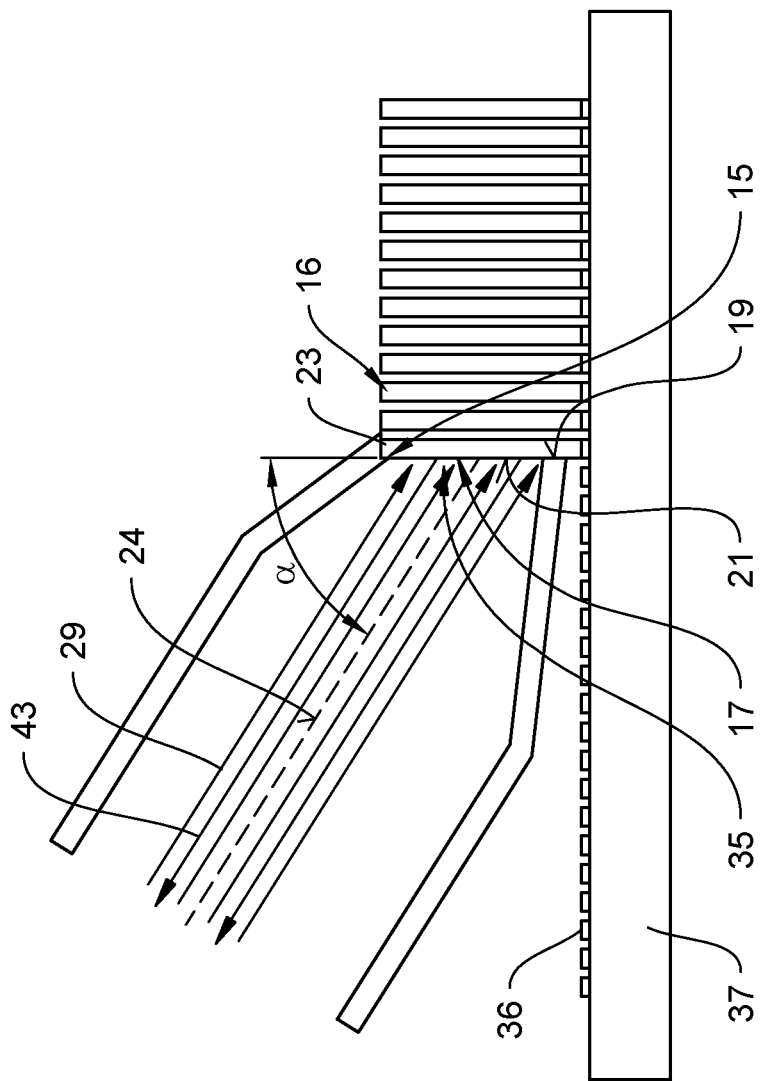
FIG. 3 shows the contact head having a test contact received in a test contact holding device during the contacting of the test contact with a contact surface of the contact carrier.

FIG. 1 shows a contact head 10, comprising a contact mouthpiece 12 mounted at a contact head basis 11 of the contact head 10, said contact mouthpiece 12 comprising a beam channel 14 arranged in an axial prolongation of a beam channel 13 of the contact head 10, said beam channel 14 terminating in a contact element holding device 15 at a free end of the contact mouthpiece 12, said contact element holding device 15 serving to receive a contact element 16, as can be seen in particular in FIGS. 2 and 3.

As is apparent from a synopsis of FIGS. 2 and 3, the contact element holding device 15 enables a positioning reception of the contact element 16 in an opening cross section 17 of a channel mouth 18 of the beam channel 14 formed in the contact element holding device 15. For producing a retaining force, by means of which the contact element 16 is held in the contact element holding device 15, an application of negative pressure to the contact element 16 received in the contact element holding device 15 is realized via the beam channels 13 and 14.

For the positioning reception of the contact element 16, the contact element holding device 15 comprises two positioning surfaces 19, 20 which, as can be seen in particular in a synopsis of FIGS. 2 and 3, enable the contact element 16 to abut against the positioning surface 19 with its rear side 21 and to abut against the positioning surface 20 with an upper edge 23 of the contact element 16, said upper edge 23 being formed by a contact bracket 22 of the contact element 16. In this case, the positioning surfaces 19, 20 are arranged at the channel mouth 18 in such a manner that the rear side 21 is arranged on a channel axis 24 at an angle α, as shown in FIG. 3.

As FIG. 1 shows, a radiation intake device 25 is provided at the upper end of the beam channel 13 formed in the contact head 10, said radiation intake device 25 comprising a focusing device 26 and a centering device 27 which enable focusing and centering a laser radiation 29 emitted by a laser device 28 arranged above the contact head 10 on the rear side 21 of a contact element 16 received in the contact element holding device 15.

As further shown in FIG. 1, a beam splitter 30 is provided in the beam channel 13 of the contact head 10, said beam splitter 30 enabling a radiation offtake of an infrared radiation portion 31 from a reflection radiation 43, said infrared radiation portion 31 being reflected by the rear side 21 of the contact element 16. The infrared radiation portion 31 is supplied to a sensor device 32, by means of which measuring the temperature T of the test contact 16 is realized as a result of the contact element 16 having been treated with the laser radiation 29, and which supplies a sensor output signal 33 corresponding to the temperature of the contact element 16 measured by means of the sensor device 32 to a controlling device 34, said controlling device 34 determining a temperature gradient of the temperature of the contact element 16 based on the sensor output signal 33 and executing a controlling of the laser device as a function of the temperature gradient in such a manner that the performance and/or the pulse duration or pulse frequency of the laser radiation 29 emitted by the laser device 28 is influenced.

As can be seen by way of the illustration in FIG. 3, an absorption surface 35 which is treated with laser radiation 29 is defined on the rear side 21 of the contact element 16 via the contact element 16 being received in the contact element holding device 15. In order to measure the temperature of the test contact 16 by means of the sensor device 32, which, as shown in FIG. 1, is treated with the infrared radiation portion 31 via the beam splitter 30, the absorption surface 35 simultaneously forms the decisive reflection surface.

FIGS. 4 to 6 schematically show a contacting process being realized after a contact element 16 has been placed on a contact surface 36 of a contact carrier 37, in which a lower contact edge 44 of the contact element 16 is made to abut against a contact surface 39 formed by a connecting material deposit 38.

In a first contacting phase, the contact element 16 abuts against the contact surface 39, still jaggedly formed due to a rough surface structure, of the connecting material deposit 38, a heat transfer surface being formed only in the area of the surface tips 41 of the contact surface 39. Starting from this still rigid state of the connecting material deposit 38, the rear side 21 of the contact element 16 is treated with laser radiation 29.

As shown in FIG. 4, relatively little heat is dissipated from the contact element 16 into the connecting material deposit 38 due to the initially very small heat transfer surface between the contact element 16 and the connecting material deposit 38 starting from a temperature T produced by the laser radiation 29 in the contact element 16, and thus the temperature or temperature gradient $dT/dt_1$ in the temperature T of the contact element 16 decreases to a correspondingly small extent, the temperature T being measured by the sensor device 32 (FIG. 1) by means of the infrared radiation portion 31 reflected by the rear side 21.

As FIG. 5 shows, in a second contacting phase the connecting material deposit 38 is at least partially fused due to the treatment with laser radiation 29 under the simultaneous impact of a contact pressure of the contact mouthpiece 12 against the contact surface 39 along a feeding axis 45, on which the contact head 10 is displaced against the contact carrier 37, and, according to the second contacting phase shown in FIG. 5, the surface tips 41 are partially levelled resulting in a corresponding enlargement of the heat transfer surface between the contact edge 44 of the contact element 16 and the connecting material deposit 38.

As the temperature progression of the temperature T of the contact element 16 shows in FIG. 5, an increase in the temperature T is realized via a corresponding controlling of the laser device 28 for compensating the temperature gradient in such a manner that the performance is increased or a further pulsing or rather increase in pulse frequency is realized in a laser device operated in pulse mode. Due to the partial fusing of the connecting material deposit 38, an increase in the heat transfer surface is realized so that more heat is dissipated corresponding to the forming of a larger temperature gradient $dT/dt_2$.

As shown in FIG. 6, the renewed decrease in temperature of the temperature T of the contact element 16 related thereto is compensated via a corresponding laser controlling and the increase in the temperature T resulting therefrom, an initially even higher temperature gradient $dT/dt_3$ being formed as a result of a further partial fusing of the connecting material deposit 38 and an embedding of the contact edge 44 into the connecting material deposit 38 resulting therefrom so that said temperature gradient serves as a parameter for the state shown in FIG. 6 of the materially bonded connection between the connecting material deposit 38 and the contact element 16 so that subsequently a contact distance a of a contact tip 42 formed at the contact bracket of the contact element 16 can be set with respect to the contact carrier 37 via a change in the distance of the contact mouthpiece 12 with respect to the contact carrier 37 via a corresponding movement of the contact head 10 on the feeding axis 45. After setting the contact distance a, the laser radiation treatment is terminated so that the relative positioning of the contact element 16 on the contact carrier 37 realized via the contacting process is frozen, and the contact element 16 can be released from the contact element holding device 15 by terminating the application of negative pressure to the contact element 16.

Figure 7:
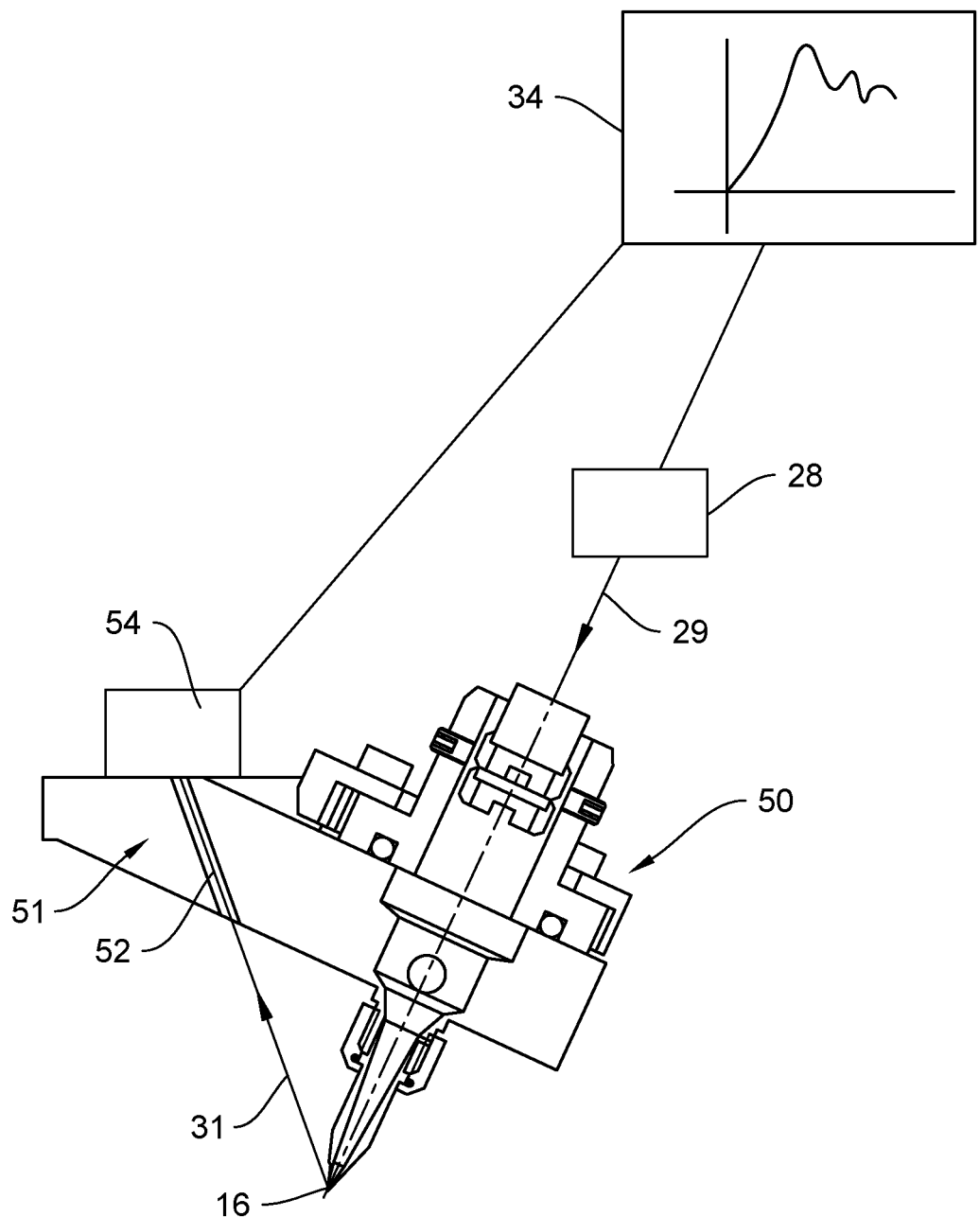
FIG. 7 shows a further embodiment of a contact head for placing and contacting a test contact.

FIG. 7 shows a further possible embodiment of a contact head 50 which is formed essentially corresponding to the contact head 10 apart from the fact that measuring the temperature T of a contact element 16 received in the contact element holding device 15 is realized by means of a further beam channel 52 formed in a contact head base 51 and being directed to the contact element holding device 15 in such a manner that an infrared radiation portion 31 reflected by a front side 53 of a contact element 16 received in the contact element holding device 15 is supplied to a sensor device 54 via the beam channel 52.

The invention claimed is:

1. A method for placing and contacting a contact element formed in particular as a test contact of a test contact arrangement, wherein in said method, for forming a heat transfer surface, a contact head provided with a contact element holding device , with the contact element received in the contact element holding device, is placed between the contact element and a connecting material deposit arranged on a contact surface of a contact carrier in the direction of a feeding axis against a contact surface of the connecting material deposit, and, for realizing an at least partial fusing of the connecting material deposit and for producing a materially bonded connection between the contact element and the connecting material deposit, thermal energy is introduced into the connecting material deposit by means of treating the contact element with thermal energy, wherein
the temperature T of the contact element is measured while the contact element is being treated and the duration of the treatment is defined as a function of a determined temperature gradient dT/dt of the temperature T of the contact element, and wherein measuring the temperature is realized by means of a sensor device being allocated to a controlling device of a laser device for laser treatment of the contact element, the controlling device controlling the operation of the laser device as a function of a temperature gradient dT/dt determined on the basis of a sensor output signal.

2. The method according to claim 1, wherein treating the contact element with thermal energy is realized as a function of the amount or the progression of the temperature gradient dT/dt.

3. The method according to claim 1, wherein treating the contact element with thermal energy is realized by means of laser radiation.

4. The method according to claim 1, wherein after reaching a defined temperature gradient dT/dt and before terminating the treatment of the contact element with thermal energy, a change in the relative position of the contact head with respect to the contact carrier is realized for setting a defined relative position of the contact element materially bonded to the connecting material deposit on the contact carrier.

5. The method according to claim 4, wherein the contact head is displaced on the feeding axis for setting a defined relative position of the contact element on the contact carrier.

6. The method according to claim 5, wherein after positioning the contact element and after a cooling phase following the termination of the treatment of the contact element with thermal energy, said contact element is released from the test contact holding device .

7. The method according to claim 1, wherein measuring the temperature of the contact element is carried out by means of measuring the thermal radiation reflected by a reference surface of the contact element.

8. The method according to claim 7, wherein the reference surface corresponds to an absorption surface of the contact element, said absorption surface being treated with thermal energy.

9. The method according to claim 7, wherein the reference surface is formed by a surface of the contact element opposite to the absorption surface.

10. The method according to claim 1, wherein measuring the temperature is realized by means of a beam splitter arranged in a beam path for treating the absorption surface with laser radiation, an offtake of an infrared beam portion from the radiation reflected by the absorption surface being realized by means of said beam splitter for application of said infrared beam portion to a sensor device.

11. The method according to claim 8, wherein measuring the temperature is realized by means of a beam channel directed to the reference surface, said beam channel being directed to a sensor device.

* * * * *